United States Patent
Imamura et al.

(10) Patent No.: US 9,716,118 B2
(45) Date of Patent: Jul. 25, 2017

(54) THIN FILM TRANSISTOR SUBSTRATE INCLUDING THIN FILM TRANSISTOR FORMED OF OXIDE SEMICONDUCTOR AND METHOD FOR MANUFACTURING THE SAME

(71) Applicant: Mitsubishi Electric Corporation, Tokyo (JP)

(72) Inventors: Ken Imamura, Kumamoto (JP); Kazushi Yamayoshi, Kumamoto (JP); Kazunori Inoue, Kamamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/940,359

(22) Filed: Nov. 13, 2015

(65) Prior Publication Data
US 2016/0190184 A1 Jun. 30, 2016

(30) Foreign Application Priority Data
Dec. 24, 2014 (JP) ................. 2014-260230

(51) Int. Cl.
*H01L 29/10* (2006.01)
*H01L 27/12* (2006.01)

(52) U.S. Cl.
CPC ...... *H01L 27/1259* (2013.01); *H01L 27/1225* (2013.01)

(58) Field of Classification Search
CPC .................................................. H01L 21/336
USPC ............................ 257/E21.409, 43; 438/104
See application file for complete search history.

(56) References Cited

U.S. PATENT DOCUMENTS

| 6,016,174 A | 1/2000 | Endo et al. |
|---|---|---|
| 6,674,093 B1 | 1/2004 | Tanaka et al. |
| 6,891,196 B2 | 5/2005 | Tanaka et al. |
| 7,532,270 B2 | 5/2009 | Hashimoto et al. |
| 2002/0158994 A1 | 10/2002 | Hashimoto et al. |

(Continued)

FOREIGN PATENT DOCUMENTS

| JP | 62-235784 | 10/1987 |
|---|---|---|
| JP | 10-268353 | 10/1998 |

(Continued)

OTHER PUBLICATIONS

Kenji Nomura, et al., "Room-temperature fabrication of transparent flexible thin-film transistors using amorphous oxide semiconductors," Nature, vol. 432 (Nov. 25, 2004) pp. 488-492.

(Continued)

*Primary Examiner* — Caleb Henry
(74) *Attorney, Agent, or Firm* — Studebaker & Brackett PC

(57) ABSTRACT

A thin film transistor (TFT) located on a thin film transistor substrate includes a first insulating film formed so as to cover a gate electrode, a channel layer that is formed at a position on the first insulating film overlapping the gate electrode and formed of an oxide semiconductor, a second insulating film formed on the channel layer, and a third insulating film formed so as to cover the second insulating film. A source electrode and a drain electrode are formed on the third insulating film. Each of the source electrode and the drain electrode is connected to the channel layer through the corresponding one of contact holes penetrating the second insulating film and the third insulating film.

7 Claims, 8 Drawing Sheets

(56) References Cited

U.S. PATENT DOCUMENTS

| | | | |
|---|---|---|---|
| 2009/0189153 A1 | 7/2009 | Iwasaki et al. | |
| 2013/0023086 A1* | 1/2013 | Chikama | G02F 1/1368 |
| | | | 438/104 |
| 2014/0070211 A1 | 3/2014 | Iwasaki et al. | |
| 2014/0131666 A1* | 5/2014 | Song | H01L 51/5275 |
| | | | 257/40 |

FOREIGN PATENT DOCUMENTS

| | | |
|---|---|---|
| JP | 2001-196595 | 7/2001 |
| JP | 2002-328395 | 11/2002 |
| JP | 2005-077822 | 3/2005 |
| JP | 2007-281409 | 10/2007 |
| JP | 2009-151285 | 7/2009 |
| JP | 2009-224207 | 10/2009 |
| WO | 2011077607 A1 | 6/2011 |

OTHER PUBLICATIONS

Official Filing Receipt issued in U.S. Appl. No. 14/884,050, mailed Oct. 30, 2015.

* cited by examiner

F I G. 2
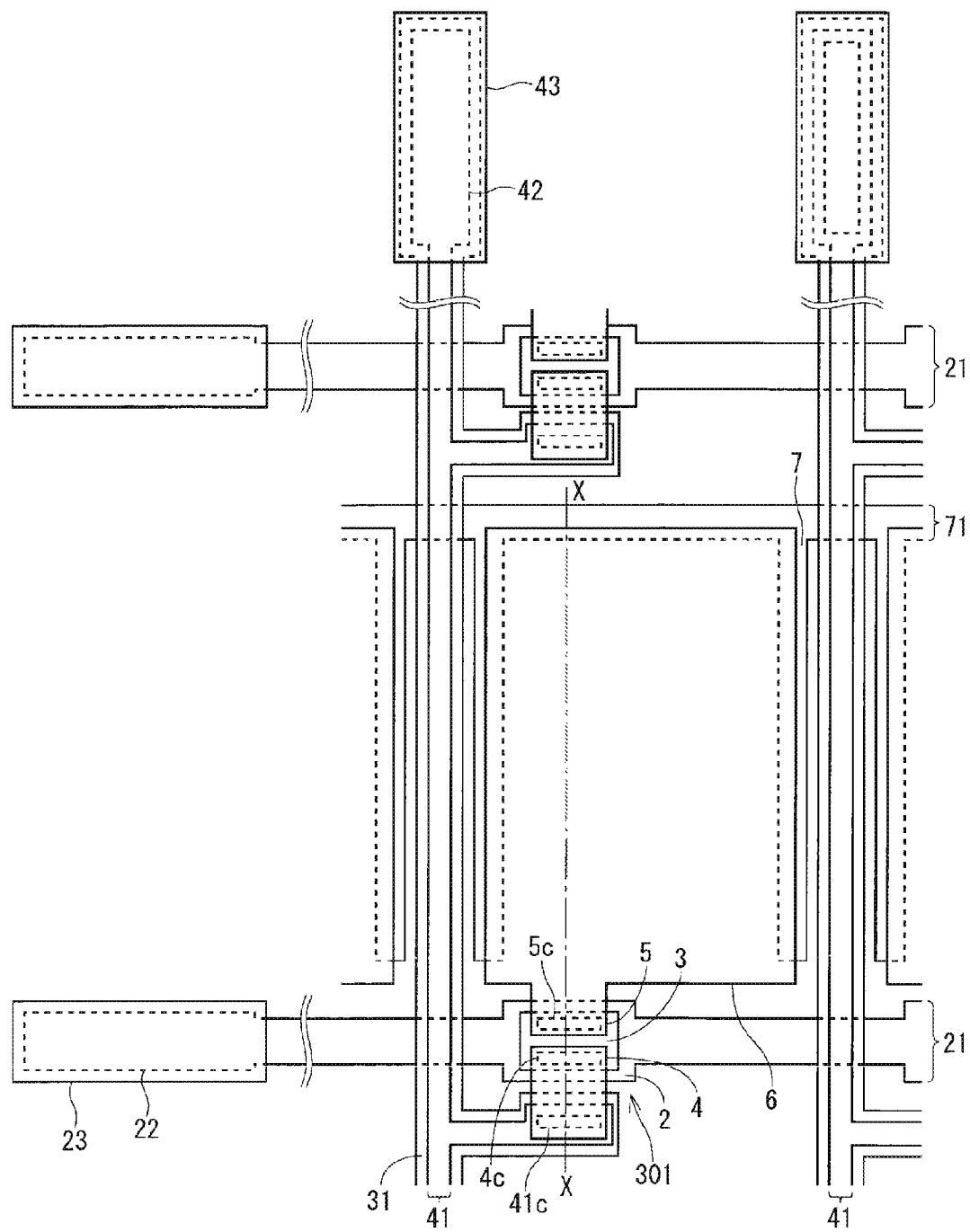

F I G . 6
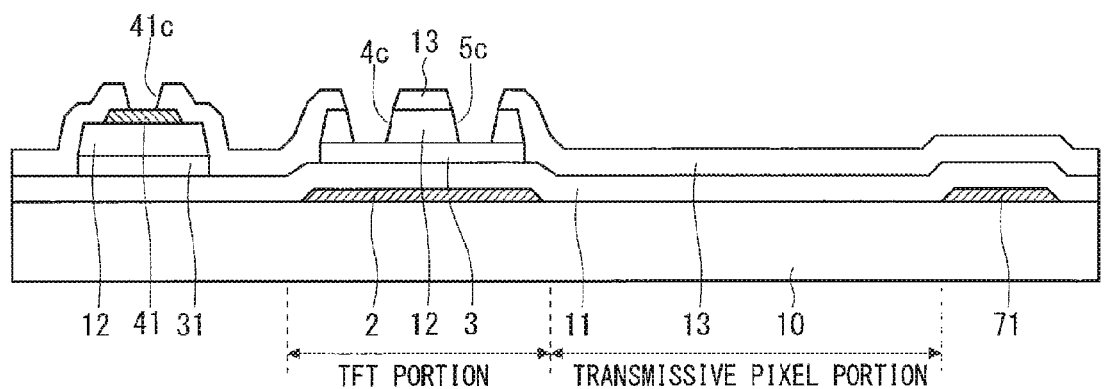
F I G . 7
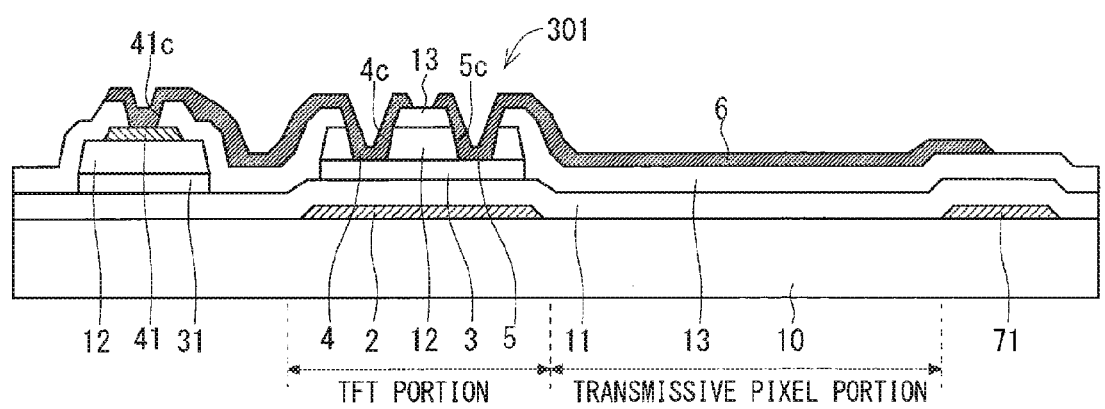

THIN FILM TRANSISTOR SUBSTRATE INCLUDING THIN FILM TRANSISTOR FORMED OF OXIDE SEMICONDUCTOR AND METHOD FOR MANUFACTURING THE SAME

BACKGROUND OF THE INVENTION

Field of the Invention

The present invention relates to a thin film transistor substrate including thin film transistors formed of an oxide semiconductor and a method for manufacturing a thin film transistor substrate.

Description of the Background Art

Thin film transistor (TFT) active matrix substrates (thin film transistor substrates (TFT substrates)) including thin film transistors (TFTs) as switching elements find use in electro-optical apparatuses such as displays (liquid crystal displays) including liquid crystals. The semiconductor devices such as the TFTs have features of being power-thrifty and thin, thus finding increasing applications to flat panel displays as a replacement for cathode ray tubes (CRTs).

The electro-optical elements for use in liquid crystal displays (LCDs) include passive matrix LCDs and TFT LCDs including TFTs as switching elements. In particular, the TFT LCDs are superior in portability and display quality to the CRTs and the passive matrix LCDs, thus finding widespread practical applications to display products such as notebook computers and TVs.

In general, the TFT LCD includes a liquid crystal display panel in which a liquid crystal layer is sandwiched between a TFT substrate and a counter substrate. The TFT substrate includes an array of a plurality of TFTs and the counter substrate includes, for example, a color filter. The liquid crystal display panel includes polarizing plates located on the front surface side and the back surface side. A backlight is located on one of these sides. This structure provides an excellent color display.

The liquid crystal driving systems for liquid crystal displays include the vertical electric field system, such as the twisted nematic (TN) mode and the vertical alignment (VA) mode, and the transverse electric field system, such as the in-plane switching (IPS) (IPS is a registered trademark) and the fringe field switching (FFS) mode. In general, liquid crystal displays employing the transverse electric field system has the advantage over the liquid crystal displays employing the vertical electric field system in the wider viewing angle, the higher resolution, and the higher luminance, thus becoming mainstream for small-to-medium-size panels such as smart phones and tablets.

The liquid crystal display panel employing the vertical electric field system includes a pixel electrode located on the TFT substrate and a common electrode located on the counter substrate. A voltage corresponding to an image signal is applied to the pixel electrode while the common electrode is fixed at a constant electric potential (common potential). Thus, liquid crystals of the liquid crystal layer are driven by the electric field substantially vertical to the surface of the liquid crystal display panel.

Meanwhile, the liquid crystal display panel employing the transverse electric field system includes the pixel electrode and the common electrode that are located on the TFT substrate, and thus, liquid crystals of the liquid crystal layer are driven by the electric field substantially horizontal to the surface of the liquid crystal display panel. In particular, the TFT substrate in the FFS mode includes the pixel electrode and the common electrode disposed opposite to each other with an insulating film located therebetween. Either the pixel electrode or the common electrode may be located below the other. The electrode located on the lower side is formed into a flat plate shape while the electrode located on the upper side is formed into a lattice pattern or a comb-teeth shape having slits.

For the switching element of the TFT substrate to be included in the conventional liquid crystal display, the semiconductor film for forming the active layer (channel layer) of the TFT has been made of amorphous silicon (a-Si). In recent years, the TFTs including an active layer made of an oxide semiconductor are actively developed. Such oxide semiconductor has a mobility higher than that of the conventionally-used amorphous silicon. The oxide semiconductor is mainly the material based on zinc oxide (ZnO) or the material based on amorphous InGaZnO obtained by adding gallium oxide ($Ga_2O_3$) and indium oxide ($In_2O_3$) to zinc oxide. This technique is disclosed in, for example, Japanese Patent Application Laid-Open No. 2005-77822, Japanese Patent Application Laid-Open No. 2007-281409, and Kenji Nomura, et al., "Room-temperature fabrication of transparent flexible thin-film transistors using amorphous oxide semiconductors," Nature, no. 432 (2004): 488-492.

Similarly to the oxide conductors being the transparent conductors such as amorphous ITO (indium oxide ($In_2O_3$)+ tin oxide ($SnO_2$)) and amorphous InZnO (indium oxide ($In_2O_3$)+zinc oxide (ZnO)), the above-mentioned oxide semiconductor can be etched with a weak acid solution containing oxalic acid or carboxylic acid, thus having the advantage of being easily patterned.

However, in some cases, the oxide semiconductor material is damaged by the acid solution used to etch a general metal film (Cr, Ti, Mo, Ta, Al, Cu, or an alloy containing these metals) which is to be formed into a source electrode and a drain electrode of the TFT, resulting in characteristics degradation. In other cases, certain kinds of oxide semiconductor materials may dissolve in the above-mentioned acid solution. Thus, in a case where the TFT (generally referred to as back channel etching (BCE) TFT) including the source electrode and the drain electrode located on the channel layer made of an oxide semiconductor is formed as shown in FIG. 11B in Japanese Patent Application Laid-Open No. 2007-281409, the channel layer is damaged, in some cases, by the acid solution used to process the source electrode and the drain electrode, resulting in the degradation in the TFT characteristics. In other cases, the channel layer is damaged due to the oxidation-reduction reaction in the interface while the metal film which is to be formed into the source electrode and the drain electrode is deposited on the oxide semiconductor film (channel layer), causing the degradation in the TFT characteristics.

These problems can be solved by, for example, applying the TFT structure that includes a protective insulating layer formed on the semiconductor layer as described in Japanese Patent Application Laid-Open No. 62-235784 (1987). Such TFT structure can prevent damage to or loss of the oxide semiconductor film involved in the etching for processing the metal film to form the source electrode and the drain electrode. The TFTs having this structure are generally referred to as "etching stopper (ES) TFTs" or "etch stopper (ES) TFTs."

For example, in FIGS. 1 and 2 of Japanese Patent Application Laid-Open No. 2005-77822, the ES TFT substrate in the TN mode is disclosed which includes the channel protective film (channel protective layer) made of silicon oxide or silicon nitride and located on the semiconductor film (channel layer) made of a metal oxide.

In general, the production of the TFT substrate in the TN mode including the back channel etching TFTs in which the a-Si semiconductor film serves as the channel layer as shown in FIGS. 1 and 2 of Japanese Patent Application Laid-Open No. 10-268353 (1998) involves five photolithography processes of: (1) forming a gate electrode; (2) forming a gate insulating film and a channel layer; (3) forming a source electrode and a drain electrode; (4) forming a contact hole in a protective insulating film; and (5) forming a pixel electrode.

The production of the FFS-TFT substrate including the back channel etching TFTs as shown in FIGS. 2 and 3 of Japanese Patent Application Laid-Open No. 2009-151285 involves seven photolithography processes of: (1) forming a gate electrode; (2) forming a gate insulating film and a channel layer; (3) forming a source electrode and a drain electrode; (4) forming a contact hole in a protective insulating film; (5) forming a pixel electrode; (6) forming a contact hole in an interlayer insulating film; and (7) forming a common electrode.

The production of the TFT substrate including the general etch stopper TFTs in which the channel layer is made of an oxide semiconductor requires at least one additional photolithography process for the formation of the protective layer on the oxide semiconductor film. Unfortunately, this additional photolithography process reduces the production capacity and increases the manufacturing cost.

For example, the method for producing the etch stopper TFT substrate in the TN mode is proposed in PCT International Publication No. 2011/077607. This method involves four photolithography processes of: (1) forming a gate electrode; (2) forming a channel layer from an oxide semiconductor; (3) forming a contact hole in a protective insulating film; and (4) forming a pixel electrode, a source electrode, and a drain electrode. (In some cases, another photolithography process for forming a source wire which is to be connected to the source electrode is performed between the process (2) and the process (3).)

In the production of a TFT substrate according to the method disclosed in PCT International Publication No. 2011/077607, a first insulating film being the same layer as the gate insulating film and a second insulating film being the same layer as the protective insulating film reside below the source wire having the source electrode of the TFT connected thereto. The process of etching the oxide semiconductor film is performed between the process of depositing the first insulating film and the process of depositing the second insulating film. In some cases, the surface of the first insulating film is damaged through the process of etching the oxide semiconductor film, resulting in the deterioration in the adhesion between the first insulating film and the second insulating film. Thus, following an extended period of use of the liquid crystal display, the source wire is likely to be broken in the area where the first insulating film and the second insulating film poorly adhere to each other. This could impair the reliability.

PCT International Publication No. 2011/077607 describes the method for reducing the number of photolithography processes for LCDs including the etch stopper TFTs, but makes no mention of the method for reducing the number of photolithography processes and the manufacturing cost for the LCDs employing the transverse electric field system (in particular, FFS LCDs).

SUMMARY OF THE INVENTION

It is an object of the present invention to prevent, with less additional photolithography processes, the deterioration in the adhesion of individual layers of the TFT substrate including etch stopper TFTs in which the TFT channel layer is formed of an oxide semiconductor.

A thin film transistor substrate according to the present invention includes a thin film transistor located on a substrate, a gate wire connected to a gate electrode of the thin film transistor, a pixel electrode connected to a drain electrode of the thin film transistor, and a source wire connected to a source electrode of the thin film transistor. The thin film transistor includes the gate electrode located on the substrate, a first insulating film located so as to cover the gate electrode, a channel layer that is located at a position on the first insulating film overlapping the gate electrode and formed of an oxide semiconductor, a second insulating film located on the channel layer, a third insulating film located so as to cover the second insulating film, and the source electrode and the drain electrode located on the third insulating film. Each of the source electrode and the drain electrode is connected to the channel layer through the corresponding one of contact holes penetrating the second insulating film and the third insulating film. Below the source wire, an oxide semiconductor film that is the same layer as the channel layer and separated from the channel layer and an insulating film that is the same layer as the second insulating film and separated from the second insulating film are located.

The TFT substrate according to the present invention eliminates or reduces, for example, the exfoliation of films in the TFT portion and the breakage of the source wire following an extended period of use of the liquid crystal display, thus improving the reliability of the liquid crystal display. The oxide semiconductor having a high mobility serves as the channel layer while keeping its high-performance characteristics. This allows for the high-yield production of a high-performance TFT substrate and the liquid crystal display including the TFT substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a plan view illustrating the configuration of a TFT substrate according to a first preferred embodiment;

FIG. 6 is a cross-sectional view illustrating a process of manufacturing the TFT substrate according to the first preferred embodiment;

FIG. 7 is a cross-sectional view illustrating a process of manufacturing the TFT substrate according to the first preferred embodiment;

DESCRIPTION OF THE PREFERRED EMBODIMENTS

First Preferred Embodiment

Figure 1:
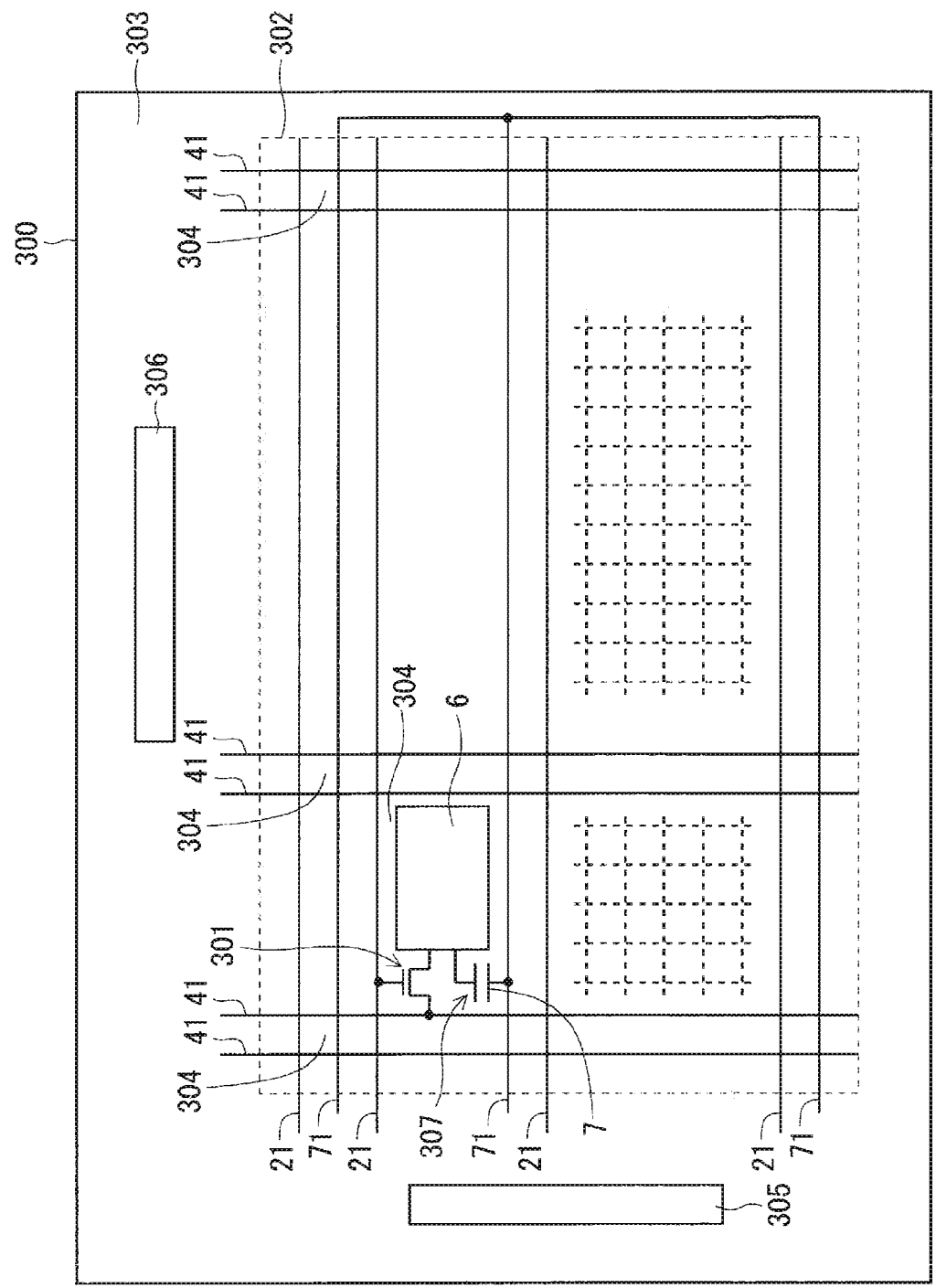
FIG. 1 is a plan view schematically illustrating the configuration of a general TFT substrate.

FIG. 1 is a plan view illustrating the configuration of a general TFT substrate. The TFT substrate is the active matrix substrate in which a plurality of thin film transistors (TFTs) being switching elements are arranged in a matrix. As an example, the following describes the TFT substrate to be included in the liquid crystal display (LCD) being a flat panel display.

A TFT substrate 300 is divided into a display region 302 in which pixels 304 including TFTs 301 are arranged in a matrix and a frame region 303 surrounding the outer side of the display region 302.

In the display region 302, a plurality of gate wires 21 (scanning signal lines) and a plurality of source wires 41 (display signal lines) are located. The plurality of gate wires 21 are arranged in parallel with each other. Similarly, the plurality of source wires 41 are arranged in parallel with each other. The plurality of gate wires 21 and the plurality of source wires 41 cross each other. With reference to FIG. 1, the gate wires 21 extend in the horizontal direction and the source wires 41 extend in the vertical direction. The region enclosed by the gate wires 21 adjacent to each other and the source wires 41 adjacent to each other is the pixel 304. Thus, the pixels 304 are arranged in a matrix in the display region 302.

With reference to FIG. 1, one of the pixels 304 is representatively illustrated. The pixel 304 includes at least one TFT 301 located therein. The TFT 301 is located near the intersection of the source wire 41 and the gate wire 21 and includes a gate electrode connected to the gate wire 21, a source electrode connected to the source wire 41, and a drain electrode connected to the a pixel electrode 6. An auxiliary capacitance 307 is formed between the pixel electrode 6 and an auxiliary capacitance electrode 7. The auxiliary capacitance electrode 7 is connected to a common wire 71 to which a predetermined potential (common potential) is supplied. The common wires 71 extend in parallel with the gate wires 21 (orthogonal to the source wires 41). The gate wires 21 and the common wires 71 are arranged in an alternating manner.

In the frame region 303 of the TFT substrate 300, a scanning signal driving circuit 305 and a display signal driving circuit 306 are located. Although not shown in FIG. 1, the gate wires 21 are drawn from the display region 302 to the frame region 303 on the scanning signal driving circuit 305 side and are connected to the scanning signal driving circuit 305. Similarly, the source wires 41 are drawn from the display region 302 to the frame region 303 on the display signal driving circuit 306 side and are connected to the display signal driving circuit 306. A connection board (not shown) for the external connection is connected to the scanning signal driving circuit 305 and the display signal driving circuit 306.

Figure 3:
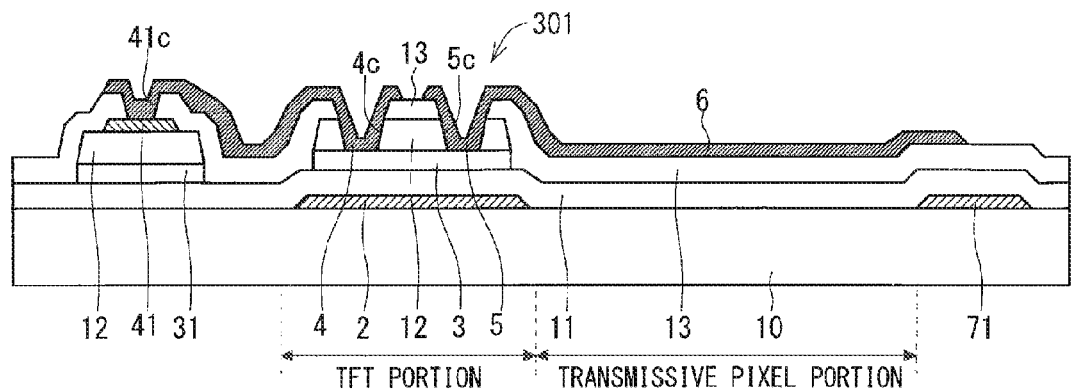
FIG. 3 is a cross-sectional view illustrating the configuration of the TFT substrate according to the first preferred embodiment.

With reference to FIGS. 2 and 3, the following describes the configuration of the TFT substrate according to this preferred embodiment. FIG. 2 is a plan view of the configuration of the TFT substrate to be included in the liquid crystal display employing the TN mode and illustrates the region (pixel portion) in which a pixel is formed, the region in which a gate terminal at the end portion of a gate wire is formed, and the region in which a source terminal at the end portion of a source wire is formed. FIG. 3 illustrates the cross-sectional configuration of the pixel portion and corresponds to the cross section taken along the line X-X in FIG. 2. As shown in FIG. 3, the cross section taken along the line X-X includes the "TFT portion" being the region in which the TFT 301 is formed and the "transmissive pixel portion" being the region in which the pixel electrode is formed.

As shown in FIG. 3, the TFT substrate is formed of a substrate 10 being a transparent insulating substrate made of, for example, glass. A gate electrode 2, the gate wire 21, the auxiliary capacitance electrode 7, the common wire 71, and a gate terminal 22 that are formed of a first conductive film are located on the substrate 10.

With reference to FIG. 2, the gate wire 21 extends in the horizontal direction. The gate electrode 2 of the TFT 301 is a part of the gate wire 21. That is, the part of the gate wire 21 in the TFT portion is the gate electrode 2. In this preferred embodiment, the part of the gate wire 21 being the gate electrode 2 is wider than the remaining part of the gate wire 21. The gate terminal 22 is formed at one end portion of the gate wire 21. The common wire 71 extends in parallel with the gate wire 21.

A first insulating film 11 is formed so as to cover the gate electrode 2, the gate wire 21, the auxiliary capacitance electrode 7, the common wire 71, and the gate terminal 22. In the TFT portion, the first insulating film 11 functions as the gate insulating film.

A channel layer 3 of the TFT 301 is located at a position on the first insulating film 11 overlapping the gate electrode 2. The channel layer 3 is made of an oxide semiconductor. An oxide semiconductor film 31 being the same layer as the channel layer 3 is located not only in the TFT portion but also below the source wire 41 and a source terminal 42 formed of a second conductive film. A second insulating film 12 is formed on the channel layer 3 and the oxide semiconductor film 31. The source wire 41 and the source terminal 42 are formed on the second insulating film 12. Thus, the laminated structure including the first insulating film 11, the oxide semiconductor film 31, and the second insulating film 12 resides below the source wire 41 and the source terminal 42.

A third insulating film 13 is formed so as to cover the second insulating film 12, the source wire 41, and the source terminal 42. Contact holes 4c, 5c, and 41c are formed in the second insulating film 12 and the third insulating film 13 so as to penetrate these films. The contact hole 4c and the contact hole 5c extend to the channel layer 3. The part of the channel layer 3 exposed to the contact hole 4c is the source region of the TFT 301 and the part of the channel layer 3 exposed to the contact hole 5c is the drain region of the TFT 301. The contact hole 41c extends to the source wire 41.

A source electrode 4, a drain electrode 5, and the pixel electrode 6 that are formed of a transparent conductive film (transmissive conductive film) are located on the third insulating film 13. The source electrode 4 and the drain electrode 5 are separated from each other. The source electrode 4 is connected to the channel layer 3 through the contact hole 4c. The drain electrode 5 is connected to the channel layer 3 through the contact hole 5c.

The source electrode 4 extends to the region in which the contact hole 41c is formed and is connected to the source wire 41 through the contact hole 41c. The drain electrode 5 is formed to be integral with the pixel electrode 6. In this configuration, the source electrode 4 is electrically connected to the source wire 41 and the drain electrode 5 is electrically connected to the pixel electrode 6.

In this preferred embodiment, the oxide semiconductor film which is formed into the channel layer 3 is, for example, the oxide semiconductor based on zinc oxide (ZnO), the oxide semiconductor based on InZnSnO obtained by adding indium oxide ($In_2O_3$) and tin oxide ($SnO_2$) to zinc oxide (ZnO), or the oxide semiconductor based on InGaZnO obtained by adding gallium oxide ($Ga_2O_3$) and indium oxide ($In_2O_3$) to zinc oxide (ZnO). The oxide semiconductor film is preferably a material that is not etched or not damaged due to etching during the processing of the source electrode 4 and the drain electrode 5 (during the etching of the second conductive film).

With reference to FIGS. 4 to 7, the following describes the method for manufacturing the TFT substrate according to the first preferred embodiment. In FIGS. 4 to 7, the constituent components same as those shown in FIGS. 2 and 3 are denoted by the same reference signs.

Firstly, the substrate 10 is cleaned with cleaning fluid or pure water. In this preferred embodiment, the glass substrate having a thickness of 0.5 mm was used as the substrate 10. Then, a first conductive film being the material of for example, the gate electrode 2 and the gate wire 21 is deposited on the entirety of one main surface of the cleaned substrate 10.

The first conductive film may be made of metal, such as chromium (Cr), molybdenum (Mo), titanium (Ti), copper (Cu), tantalum (Ta), tungsten (W) and aluminum (Al), or an alloy obtained by adding at least one different element to the above-mentioned metallic element being the base component. The base component element is the element of the highest content among the elements contained in the alloy. The first conductive film may have a laminated structure including at least two layers of such metal or alloy. A low-resistant conductive film having a specific resistance value of 50 µΩ cm or less can be made of such metal or alloy. In this preferred embodiment, an aluminum (Al) alloy film was used as the first conductive film. The aluminum alloy film having a thickness of 200 nm was deposited by sputtering, using argon (Ar) gas.

Figure 4:
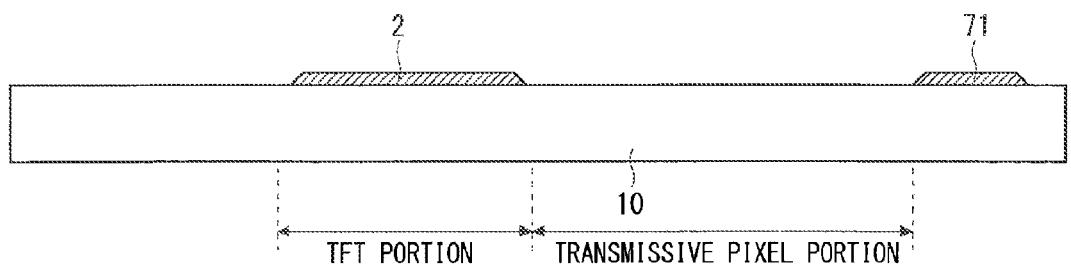
FIG. 4 is a cross-sectional view illustrating a process of manufacturing the TFT substrate according to the first preferred embodiment.

Then, a photoresist material is applied onto the first conductive film. In a first photolithography process, a photoresist pattern is formed and the first conductive film is etched to be patterned, using the photoresist pattern as a mask. In this example, the first conductive film was wet-etched with a solution (PAN chemical solution) containing, for example, phosphoric acid, acetic acid, and nitric acid. Then, the photoresist pattern is removed, and accordingly, the gate electrode 2, the gate wire 21, the auxiliary capacitance electrode 7, the common wire 71, and the gate terminal 22 are formed on the substrate 10 (FIG. 4).

Next, the first insulating film 11 is deposited on the entire upper surface of the substrate 10. In this preferred embodiment, a silicon oxide (SiO) film and a silicon nitride (SiN) film were deposited by chemical vapor deposition (CVD) to form the first insulating film 11. The silicon oxide film has poor barrier properties (shielding properties) against impurity elements affecting the TFT characteristics, such as water ($H_2O$), hydrogen ($H_2$), sodium (Na), and potassium (K). In this preferred embodiment, a silicon nitride film having excellent barrier properties was disposed below the silicon oxide film. In this example, the first insulating film 11 was formed as a laminated structure including a silicon oxide film having a thickness of 50 nm and a silicon nitride film having a thickness of 400 nm. The first insulating film 11 functions as the gate insulating film of the TFT 301.

Then, an oxide semiconductor film being the material of the channel layer 3 is deposited on the first insulating film 11. In this preferred embodiment, the oxide (such as InGaZnO) containing In, Ga, and Zn is used as the oxide semiconductor. In particular, an InGaZnO film was deposited by sputtering, using an In—Ga—Zn—O target [$In_2O_3.Ga_2O_3.(ZnO)_2$] in which the atomic composition ratio of In:Ga:Zn:O is 1:1:1:4.

Next, the second insulating film 12 is deposited. In this preferred embodiment, a SiO film was formed as the second insulating film 12 by CVD. In this example, a SiO film having a thickness of 100 nm was deposited.

Next, a second conductive film being the material of, for example, the source electrode 4, the drain electrode 5, and the pixel electrode 6 is deposited on the second insulating film 12. In this preferred embodiment, a laminated film including molybdenum (Mo) and aluminum (Al) was used as the second conductive film. Alternatively, the second conductive film may be made of the alloy obtained by adding trace amounts of another element to each of molybdenum (Mo) and aluminum (Al).

Consequently, a laminated film including the oxide semiconductor film, the second insulating film 12, and the second conductive film laminated in the stated order is formed on the first insulating film 11. In a second photolithography process, a photoresist pattern is formed and the laminated film is etched to be patterned, using the photoresist pattern as a mask. The photoresist pattern is formed on the region in which the channel layer 3 is formed and the region in which the source wire 41 and the source terminal 42 are formed. In the formation of the photoresist pattern, the exposure (half exposure) through the use of a half exposure mask referred to as "gray-tone mask" or "half-tone mask" is performed. Thus, the photoresist pattern is formed to be thicker on the region in which the source wire 41 and the source terminal 42 are formed than on the remaining part. (The thicker portion of the photoresist pattern has a width slightly greater than the region in which the source wire 41 and the source terminal 42 are actually formed.)

The second conductive film (the laminated film including Mo and Al) may be wet-etched with a solution (PAN chemical solution) containing, for example, phosphoric acid, acetic acid, and nitric acid. In this example, the second conductive film was etched with the PAN chemical solution containing 70 wt % phosphoric acid, 7 wt % acetic acid, 5 wt % nitric acid, and water. The oxide semiconductor film being the channel layer 3 is covered by the second insulating film 12, and thus, is not damaged by the chemical solution used in etching.

Subsequent to the etching of the second conductive film, the second insulating film 12 (the SiO film) located below the second conductive film is etched. The second insulating film 12 may be dry-etched with a gas containing, for example, fluorine. In this example, the second insulating film 12 was dry-etched with a gas obtained by adding oxygen ($O_2$) to sulfur hexafluoride ($SF_6$). The addition of the $O_2$ gas can prevent or reduce the damage to the oxide semiconductor film below the second insulating film 12 caused by oxidation-reduction reaction during etching.

Then, the oxide semiconductor film is etched. The oxide semiconductor film may be wet-etched with a chemical solution containing, for example, carboxylic acid. The chemical solution containing carboxylic acid preferably has an oxalic acid content of, for example, 1 to 10 wt %. In this preferred embodiment, the oxide semiconductor film was etched with an oxalic-acid-based chemical solution containing 5 wt % oxalic acid and water.

Then, the oxygen ashing is performed to reduce the thickness of the photoresist pattern. The photoresist pattern is originally formed to be thicker on the region in which the source wire 41 and the source terminal 42 are formed. Thus, after the oxygen ashing, the photoresist pattern is left only on the region in which the source wire 41 and the source terminal 42 are formed.

Figure 5:
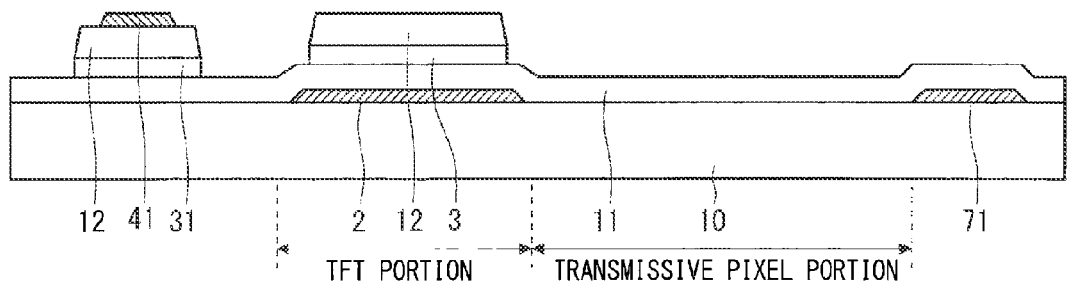
FIG. 5 is a cross-sectional view illustrating a process of manufacturing the TFT substrate according to the first preferred embodiment.

Then, the second conductive film is etched, using the remaining photoresist patter as a mask. Consequently, the second conductive film is formed into the pattern of the source wire 41 and the source terminal 42. The second conductive film may be etched with the same PAN chemical solution as the one mentioned above. Then, the photoresist pattern is removed. In the TFT region, the laminated structure including the channel layer 3 and the second insulating film 12 is formed on the first insulating film 11. In the formation region for the source wire 41 and the source terminal 42, the source wire 41 and the source terminal 42 located on the laminated structure including the oxide semiconductor film 31 and the second insulating film 12 are formed over the first insulating film 11 (FIG. 5).

Thus, the TFT substrate according to this preferred embodiment has the structure in which the oxide semiconductor film 31 and the second insulating film 12 are left below the source wire 41 and the source terminal 42. The photoresist pattern for forming the source wire 41 and the source terminal 42 through patterning has a width smaller than the width of the photoresist pattern for patterning the oxide semiconductor film 31 and the second insulating film 12 through the oxygen ashing mentioned above. As shown in FIG. 5, the source wire 41 therefore has a width smaller than the width of the oxide semiconductor film 31 and the width of the second insulating film 12 that are located below the source wire 41.

Then, the third insulating film 13 is deposited on the entire upper surface of the substrate 10. In this preferred embodiment, the third insulating film 13 was formed by depositing, by CVD, a SiO film having a thickness of 200 nm and depositing a SiN film having a thickness of 100 nm on the SiO film.

Then, in a third photolithography process, a photoresist pattern is formed, and the third insulating film 13 and the second insulating film 12 are etched, using the photoresist pattern as a mask. The third insulating film 13 and the second insulating film 12 may dry-etched with a gas containing fluorine. In this example, the third insulating film 13 and the second insulating film 12 were dry-etched with a gas obtained by adding oxygen ($O_2$) to sulfur hexafluoride ($SF_6$). Then, the photoresist pattern is removed, and accordingly, the contact holes 41c, 4c, and 5c are formed (FIG. 6). Although not shown in FIG. 6, the third insulating film 13 on and around the gate terminal 22 and the source terminal 42 is also removed in this process.

Then, a third conductive film is deposited. In this preferred embodiment, a transparent conductive film (light-transmissive conductive film) is used as the third conductive film. The transparent conductive film is ITO in which the mixing ratio of indium oxide ($In_2O_3$) and tin oxide ($SnO_2$) is, for example, 90:10 (weight percentage). In this example, an ITO film having a thickness of 100 nm and being in the amorphous state is deposited by sputtering, using a mixture gas of argon (Ar) gas and a gas containing hydrogen (H) such as hydrogen ($H_2$) gas or water vapor ($H_2O$).

Next, in a fourth photolithography process, a photoresist pattern is formed and the third conductive film (the amorphous ITO film) is etched, using the photoresist pattern as a mask. The third conductive film was wet-etched with an oxalic-acid-based chemical solution containing 5 wt % oxalic acid and water. Then, the photoresist pattern is removed, and accordingly, the source electrode 4, the drain electrode 5, and the pixel electrode 6 are formed (FIG. 7). The source electrode 4 is connected to the channel layer 3 through the contact hole 4c and connected to the source wire 41 through the contact hole 41c. The drain electrode 5 is connected to the channel layer 3 through the contact hole 5c.

Although not shown in FIG. 7, pads 23 and 43 connected to the gate terminal 22 and the source terminal 42 through the contact holes are formed on these terminals from the third conductive film. Thus, the TFT substrate illustrated in FIGS. 2 and 3 is completed.

During the assembly of the liquid crystal display panel, an alignment film and a spacer are formed on the surface of the completed TFT substrate. The alignment film is the film for aligning liquid crystals and is made of, for example, polyimide. The counter substrate including a color filter and an alignment film that have been individually produced is bonded to the TFT substrate according to this preferred embodiment. The TFT substrate and the counter substrate have a clearance formed by the spacer located therebetween. The liquid crystal layer is formed and sealed in the clearance. Thus, the liquid crystal display panel in the TN mode is formed. Finally, polarizing plates, phase difference plates, and a backlight unit are mainly disposed on the outer side of the liquid crystal display panel, so that the liquid crystal display is completed.

In this preferred embodiment, the surface of the channel layer 3 is not exposed to the etching of the second conductive film for forming the source electrode 4 and the drain electrode 5 in the formation of the etch stopper TFT including the channel layer made of an oxide semiconductor. This can prevent the loss of and damage to the channel layer 3 associated with the etching. The TFT substrate including the etch stopper TFTs can be formed through four photolithography processes. This allows for the high-yield production of the TFT substrate including the TFTs 301 having excellent characteristics with no additional photolithography processes.

In the formation of the laminated structure including the first insulating film 11, the oxide semiconductor film, the second insulating film 12, and the third insulating film 13, the formation of each layer does not involve the wet-etching processing and the dry-etching processing. Thus, the surface of each layer is not damaged, preventing the adhesion of the individual layers from deteriorating. Following an extended period of use, the exfoliation of films in the TFT portion and the breakage of the source wire 41 are eliminated or reduced, thus producing the effect of improved reliability.

Second Preferred Embodiment

In the first preferred embodiment, the application of the present invention to the TFT substrate to be included in the liquid crystal display in the TN mode has been described as an example. In a second preferred embodiment, the application of the present invention to the TFT substrate to be included in the liquid crystal display in the FFS is described as an example.

Figure 8:
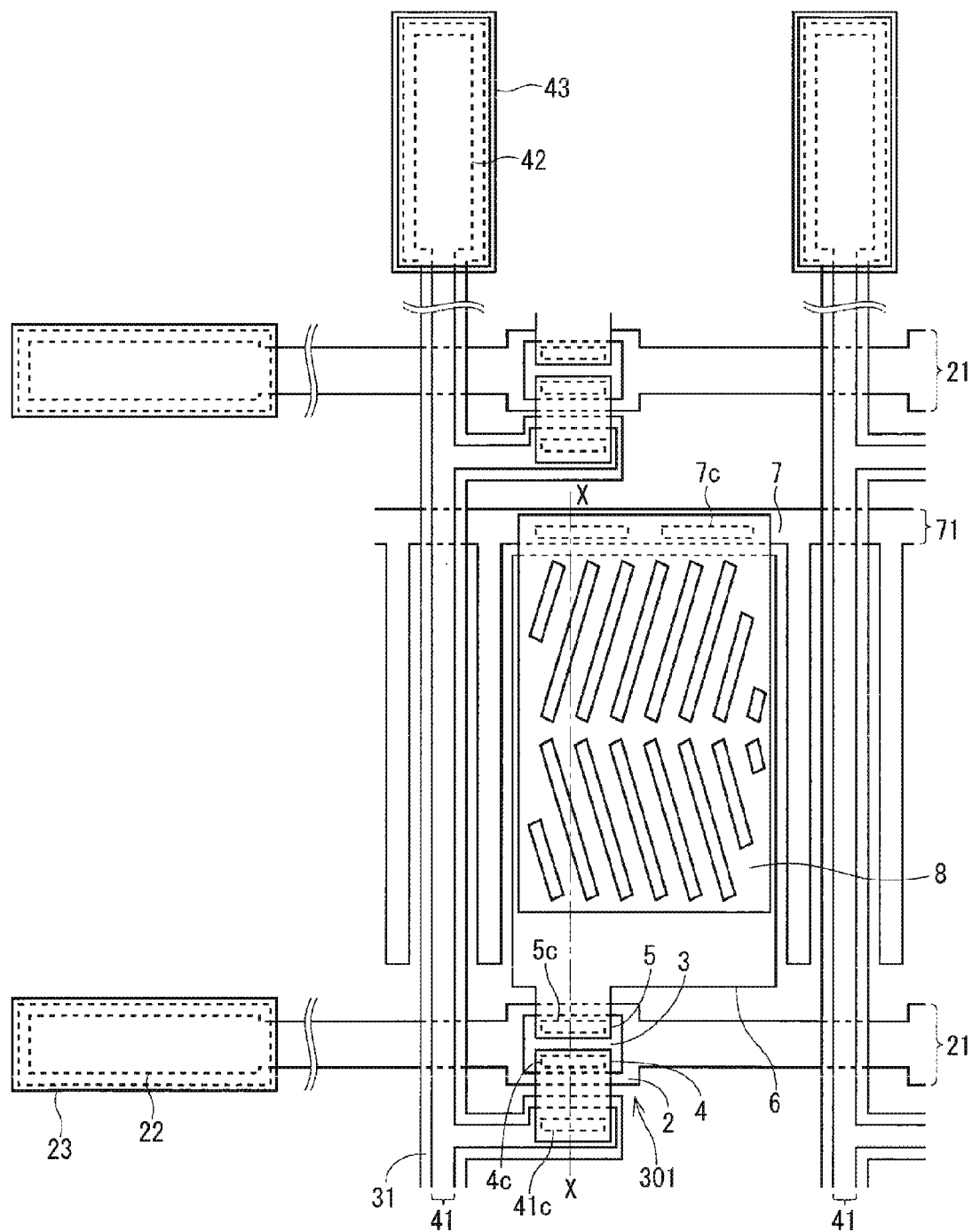
FIG. 8 is a plan view illustrating the configuration of a TFT substrate according to a second preferred embodiment.
Figure 9:
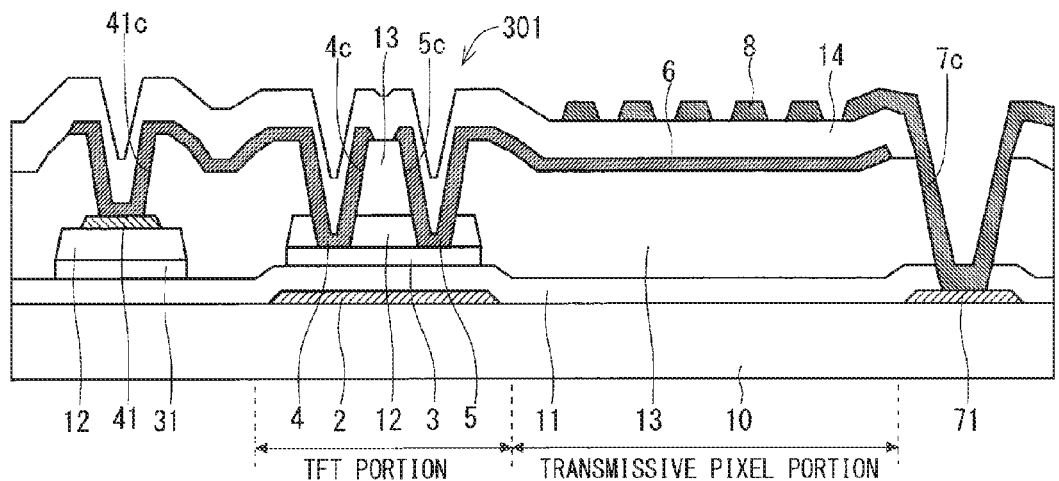
FIG. 9 is a cross-sectional view illustrating the configuration of the TFT substrate according to the second preferred embodiment.

With reference to FIGS. 8 and 9, the following describes the configuration of a TFT substrate according to this preferred embodiment. FIG. 8 is a plan view of the configuration of the TFT substrate to be included in the liquid crystal display in the FFS mode and illustrates the region (the pixel portion) in which pixels are formed, the region in which the gate terminal at the end portion of the gate wire is formed, and the region in which the source terminal at the end portion of the source wire is formed. FIG. 9 illustrates the cross-sectional configuration of the pixel portion and corresponds to the cross section taken along the line X-X in FIG. 8. In each of the drawings, constituent components having the same functions as those described in the first preferred embodiment are denoted by the same reference signs, and the detailed description thereof is omitted.

As shown in FIGS. 8 and 9, the TFT substrate in the FFS mode includes a common electrode 8 located opposite to the pixel electrode 6. In this preferred embodiment, the common electrode 8 is located over the pixel electrode 6 with a fourth insulating film 14 located therebetween. The pixel electrode 6 is formed of the third conductive film (a first transparent conductive film) as in the first preferred embodiment. The common electrode 8 is formed of a fourth conductive film (a second transparent conductive film). The common electrode 8, which has a lattice shape or a comb-teeth shape with slits provided therein, is electrically connected to the common wire 71 through a contact hole 7c penetrating the fourth insulating film 14, the third insulating film 13, and the first insulating film 11.

In this preferred embodiment, the fourth insulating film 14 is formed from an organic resin film to have a great thickness, thereby improving the flatness of the upper surface of the TFT substrate. (The organic resin film is hereinafter also referred to as "planarization film.")

Next, with reference to FIGS. 10 to 15, the following describes a method for manufacturing the TFT substrate according to the second preferred embodiment. In FIGS. 10 to 15, the constituent components same as those shown in FIGS. 8 and 9 are denoted by the same reference signs.

Figure 10:
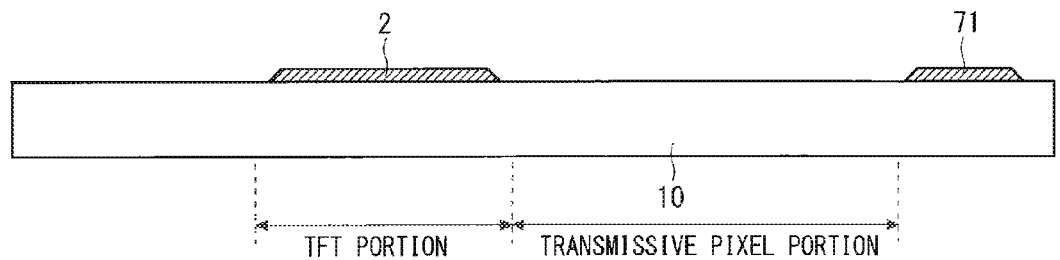
FIG. 10 is a cross-sectional view illustrating a process of manufacturing the TFT substrate according to the second preferred embodiment.
Figure 11:
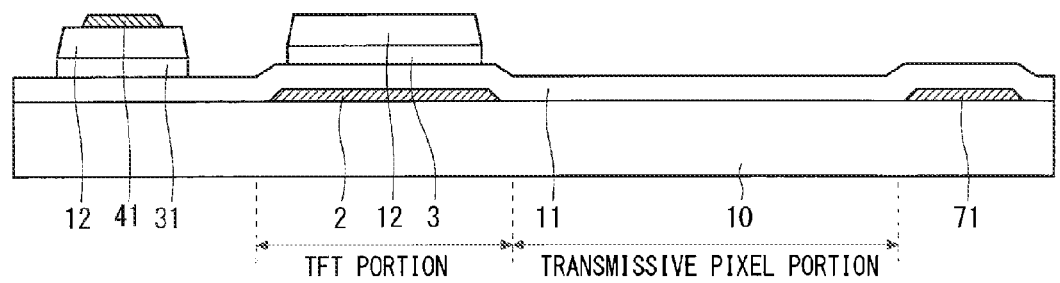
FIG. 11 is a cross-sectional view illustrating a process of manufacturing the TFT substrate according to the second preferred embodiment.

Firstly, as in the first preferred embodiment, the gate electrode 2, the gate wire 21, the auxiliary capacitance electrode 7, the common wire 71 and the gate terminal 22 are formed on the substrate 10 through a first photolithography process (FIG. 10). Then, the first insulating film 11 is formed. After that, through a second photolithography process in which the half exposure mask is used, the lamination structure including the channel layer 3 and the second insulating film 12 are formed on the first insulating film 11 and the source wire 41 and the source terminal 42 are formed over the first insulating film 11. (The oxide semiconductor film 31 and the second insulating film 12 are left below the source wire 41 and the source terminal 42.) (FIG. 11)

Figure 12:
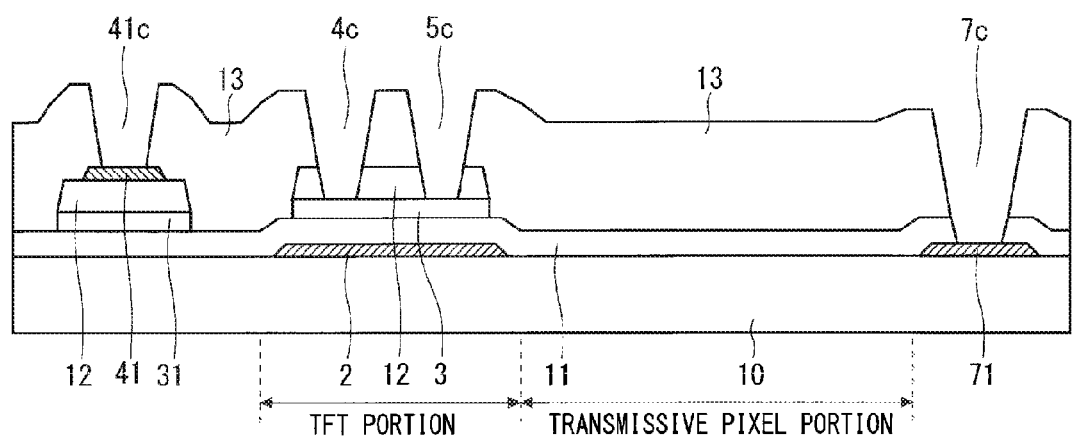
FIG. 12 is a cross-sectional view illustrating a process of manufacturing the TFT substrate according to the second preferred embodiment.

Next, the third insulating film 13 which is to serve as the planarization film is formed. In this example, a photosensitive organic resin is applied by, for example, spin coating to form a film having a thickness of 2 to 4 µm. Then, in a third photolithography process, the third insulating film 13 is exposed and developed, and accordingly, the contact holes 4c, 5c, 7c, and 41c are formed (FIG. 12). Although not shown FIG. 12, the third insulating film 13 is removed from the regions in which the gate wire 21 and the source terminal 42 are formed.

Figure 13:
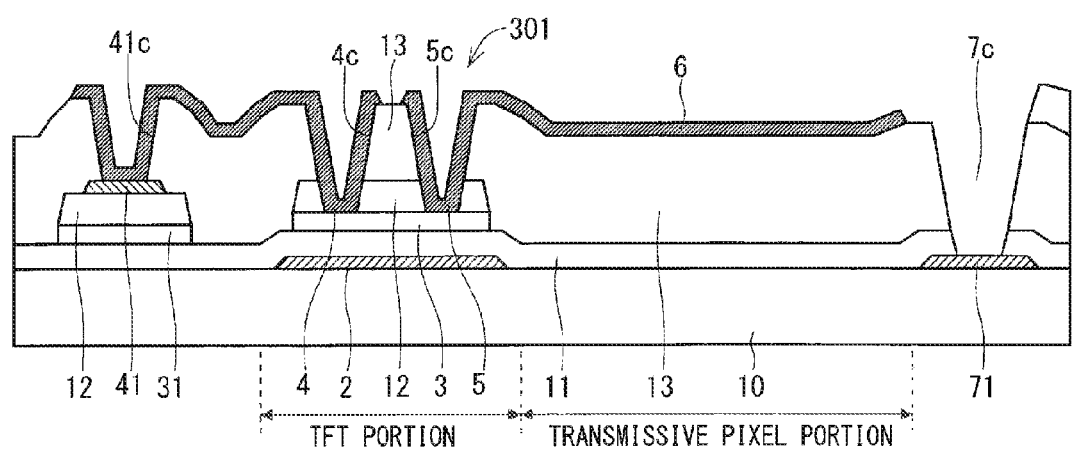
FIG. 13 is a cross-sectional view illustrating a process of manufacturing the TFT substrate according to the second preferred embodiment.
Figure 14:
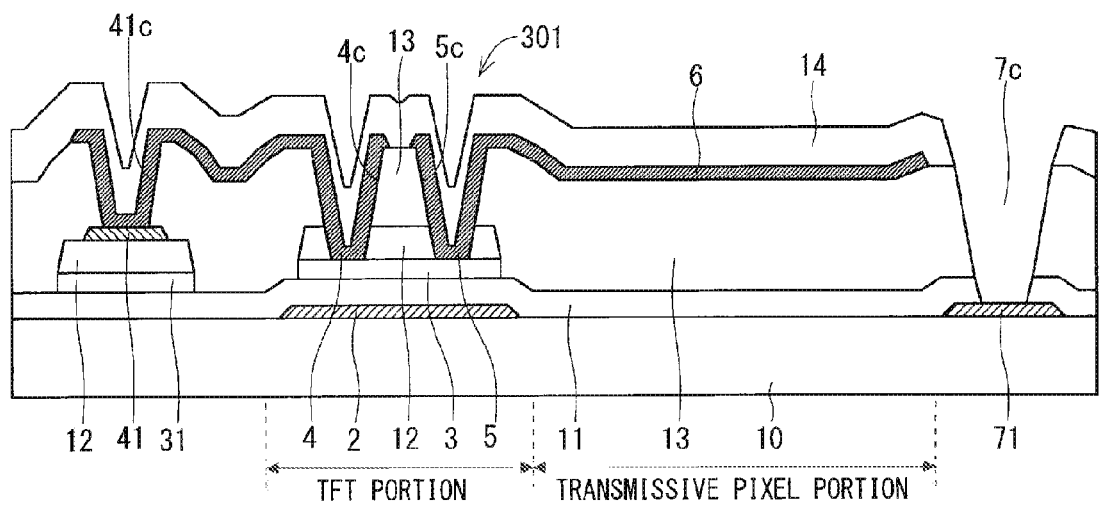
FIG. 14 is a cross-sectional view illustrating a process of manufacturing the TFT substrate according to the second preferred embodiment.

Next, a third conductive film (first transparent conductive film) is deposited on the entire surface of the substrate 10 by, for example, sputtering. In a fourth photolithography process, a photoresist pattern is formed and the third conductive film is etched, using the photoresist pattern as a mask. Then, the photoresist pattern is removed, and accordingly, the source electrode 4, the drain electrode 5, and the pixel electrode 6 are formed (FIG. 13). The source electrode 4 is connected to the channel layer 3 through the contact hole 4c and connected to the source wire 41 through the contact hole 41c. The drain electrode 5 is connected to the channel layer 3 through the contact hole 5c.

Next, the fourth insulating film 14 is deposited on the entire surface of the substrate 10 by, for example, CVD. The fourth insulating film 14 is also formed inside the contact hole 7c that has been formed earlier. Thus, the contact hole 7c is formed again in a fifth photolithography process. (The fourth insulating film 14 inside the contact hole 7c is removed.) (FIG. 14) Although not shown in FIG. 14, the fourth insulating film 14 is also removed from the regions in which the gate terminal 22 and the source terminal 42 are formed and from the outer periphery portions of these regions.

Figure 15:
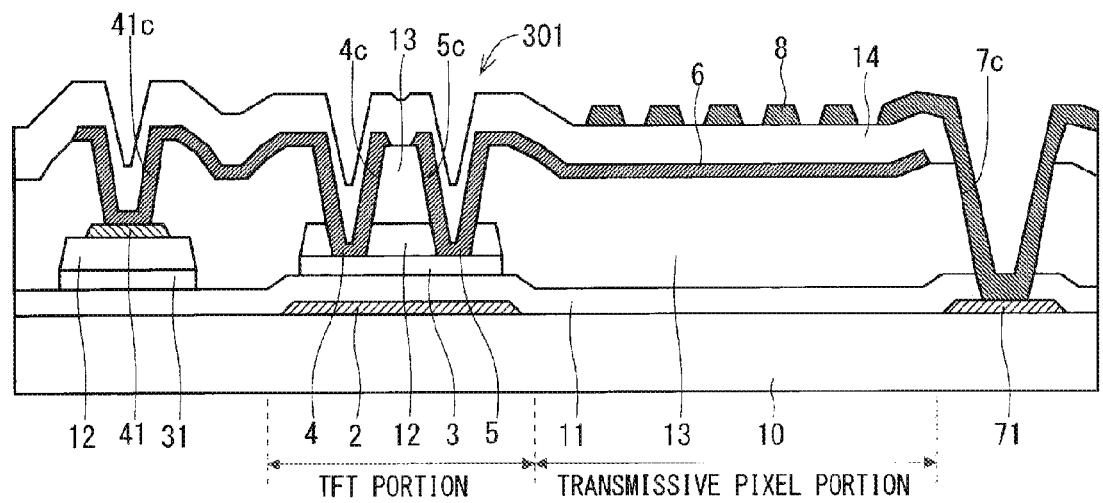
FIG. 15 is a cross-sectional view illustrating a process of manufacturing the TFT substrate according to the second preferred embodiment.

Then, a fourth conductive film (second transparent conductive film) being the material of the common wire 8 is deposited on the entire surface of the substrate including the inside of the contact hole 7c. In this example, the fourth conductive film is formed of ITO by sputtering. Then, in a sixth photolithography process, the fourth conductive film is patterned, and accordingly, the common electrode 8 having slits is formed (FIG. 15). The common electrode 8 is electrically connected to the auxiliary capacitance electrode 7 through the contact hole 7c.

Although not shown FIG. 15, the pads 23 and 43 connected to the gate terminal 22 and the source terminal 42 are formed on these terminals from the fourth conductive film. Thus, the TFT substrate illustrated in FIGS. 8 and 9 is completed.

In this preferred embodiment, the third insulating film 13 was formed from the photosensitive organic resin film, which is not limited thereto. Alternatively, the third insulating film 13 may be a SiO film, a SiN film, or a lamination of these films formed as the lower layer of the organic resin film by CVD. If this is the case, the pattern for forming the contact holes 4c, 5c, 7c, and 41c in the organic resin film is formed, and then, the SiO film and the SiN film being the lower layer are etched, using the organic resin film as a mask. Thus, the contact holes 4c, 5c, 7c, and 41 are formed.

Instead of the organic resin film, a SiO film, a SiN film, or a lamination of these films may be solely used as the third insulating film 13. If this is the case, the SiO film and SiN are deposited. Then, a photoresist pattern is formed and the SiO film and the SiN film are etched, using the photoresist pattern as a mask. Then, the photoresist pattern is removed, and accordingly, the contact holes 4c, 5c, 7c, and 41c are formed.

As described above, in the second preferred embodiment as well, the surface of the channel layer 3 is not exposed to the etching of the second conductive film for forming the source electrode 4 and the drain electrode 5 in the formation of the etch stopper TFT including the channel layer made of an oxide semiconductor film. This prevents the loss of and the damage to the channel layer 3 associated with the etching. The TFT substrate in the FFS mode including the etch stopper TFTs can be formed through six photolithography processes. This allows for the high-yield production of the TFT substrate including the TFTs 301 having excellent characteristics.

In the present invention, the above preferred embodiments can be arbitrarily combined, or each preferred embodiment can be appropriately varied or omitted within the scope of the invention While the invention has been shown and described in detail, the foregoing description is in all aspects illustrative and not restrictive. It is therefore understood that numerous modifications and variations can be devised without departing from the scope of the invention.

What is claimed is:

1. A thin film transistor substrate comprising:
   a thin film transistor located on a substrate;
   a gate wire connected to a gate electrode of said thin film transistor;
   a pixel electrode connected to a drain electrode of said thin film transistor;
   a source wire connected to a source electrode of said thin film transistor, wherein
   said thin film transistor includes:
      said gate electrode located on said substrate;
      a first insulating film located so as to cover said gate electrode;
      a channel layer located at a position on said first insulating film overlapping said gate electrode, said channel layer being formed of an oxide semiconductor;
      a second insulating film located on said channel layer;
      a third insulating film located so as to cover said second insulating film; and
      said source electrode and said drain electrode located on said third insulating film,
   each of said source electrode and said drain electrode is connected to said channel layer through corresponding one of contact holes penetrating said second insulating film and said third insulating film, and
   said source wire is over and covers both an oxide semiconductor film that is the same layer as said channel layer and separated from said channel layer and an insulating film that is the same layer as said second insulating film and separated from said second insulating film.

2. The thin film transistor substrate according to claim 1, wherein said source electrode and said drain electrode are formed of a transparent conductive film being the same layer as said pixel electrode.

3. The thin film transistor substrate according to claim 1, wherein said source electrode is connected to said source wire through a contact hole penetrating said third insulating film.

4. The thin film transistor substrate according to claim 1, wherein said source wire has a width smaller than a width of said oxide semiconductor film and a width of said insulating film being the same layer as said second insulating film that are located below said source wire.

5. The thin film transistor substrate according to claim 1, further comprising:
   a common wire formed of a conductive film being the same layer as said gate electrode;
   a fourth insulating film located so as to cover said pixel electrode; and
   a common electrode located at a position on said fourth insulating film overlapping said pixel electrode,
   wherein said common electrode is connected to said common wire through a contact hole penetrating said first insulating film, said third insulating film, and said fourth insulating film.

6. The thin film transistor substrate according to claim 1, wherein said source wire directly contacts said insulating film.

7. The thin film transistor substrate according to claim 6, wherein said insulating film directly contacts said oxide semiconductor film.

* * * * *